United States Patent
Hsu et al.

(10) Patent No.: US 9,367,091 B2
(45) Date of Patent: Jun. 14, 2016

(54) ADJUSTABLE DOCKING DEVICE AND DISPLAY DEVICE THEREWITH

(71) Applicant: Wistron Corporation, New Taipei (TW)

(72) Inventors: Chun-Peng Hsu, New Taipei (TW);
Chin-Hsien Chen, New Taipei (TW);
Wen-Chin Wu, New Taipei (TW);
Chien Huang, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 42 days.

(21) Appl. No.: 14/585,151

(22) Filed: Dec. 29, 2014

(65) Prior Publication Data

US 2016/0062400 A1 Mar. 3, 2016

(30) Foreign Application Priority Data

Aug. 27, 2014 (TW) .............................. 103129581 A

(51) Int. Cl.
*G06F 1/16* (2006.01)
*H05K 5/02* (2006.01)

(52) U.S. Cl.
CPC ............ *G06F 1/1632* (2013.01); *G06F 1/1601* (2013.01); *G06F 1/1626* (2013.01); *H05K 5/0221* (2013.01); *H05K 5/0226* (2013.01); *H01R 2201/06* (2013.01); *H04N 2201/0058* (2013.01)

(58) Field of Classification Search
CPC ... G06F 1/1632; G06F 1/1626; G06F 1/1601; G06F 1/1654; H05K 5/0221; H05K 5/0226; H04N 2201/0058; H01R 2201/06
USPC .......................... 361/679.02, 679.21, 679.22, 361/679.41–679.44, 679.55–679.6; 312/223.1, 223.2; 710/303, 304
See application file for complete search history.

(56) References Cited

U.S. PATENT DOCUMENTS

| 5,526,493 A * | 6/1996 | Shu .................. G06F 1/1632 361/679.41 |
| 5,692,400 A * | 12/1997 | Bliven ............... E05B 73/0005 361/679.43 |
| 2012/0037771 A1* | 2/2012 | Kitchen .............. G06F 1/1632 248/223.41 |
| 2013/0155583 A1* | 6/2013 | Yang .................. G06F 1/1626 361/679.01 |
| 2013/0176673 A1* | 7/2013 | Yen .................... G06F 1/1632 361/679.26 |
| 2014/0133080 A1* | 5/2014 | Hwang ............... G06F 1/1632 361/679.17 |
| 2015/0120980 A1* | 4/2015 | Kim .................... G06F 1/1632 710/303 |

FOREIGN PATENT DOCUMENTS

TW M258325 3/2005

* cited by examiner

*Primary Examiner* — Hoa C Nguyen
*Assistant Examiner* — Sagar Shrestha
(74) *Attorney, Agent, or Firm* — Winston Hsu; Scott Margo

(57) ABSTRACT

An adjustable docking device includes a hinge mechanism, a holding base, a guiding member, and a fixing mechanism. The hinge mechanism is installed on a frame. The holding base is pivoted to the frame by the hinge mechanism. The holding base includes a main casing, a first holding casing and a second holding casing. The first holding casing and the second holding casing respectively extends from the main casing. The main casing, the first holding casing, and a second holding casing cooperatively define a clamping slot for holding an electronic device. The guiding member is disposed inside the clamping slot and for guiding the electronic device into the clamping slot. The fixing mechanism is disposed inside the holding base and capable of switching between a locking status and a releasing status, so as to lock or release the electronic device.

20 Claims, 9 Drawing Sheets

ADJUSTABLE DOCKING DEVICE AND DISPLAY DEVICE THEREWITH

BACKGROUND OF THE INVENTION

1. Field of the Invention

The present disclosure relates to a docking device and a display device therewith, and more particularly, to an adjustable docking device with capability of guiding electronic devices with difference sizes and with clamping stability and a display device therewith.

2. Description of the Prior Art

With the development of the touch panel industry, a tablet computer has been gradually applied in people's daily life. A docking device is utilized for connecting the tablet computer to a display device, so that the display device is able to display a working interface on the tablet computer as the tablet computer is in use. However, since the conventional docking device adopts a connector to mate with another connector of the tablet computer, it leads to damage of the connector of the docking device and the connector of the tablet computer due to improper alignment during the above-mentioned mating process.

SUMMARY OF THE INVENTION

Therefore, the present disclosure provides an adjustable docking device with capability of guiding electronic devices with difference sizes and with clamping stability and a display device therewith for solving above drawbacks.

According to the claimed disclosure, an adjustable docking device installed on a frame includes a hinge mechanism, a holding base, at least one guiding member, and at least one fixing mechanism. The hinge mechanism is installed on the frame. The holding base is pivoted to the frame by the hinge mechanism. The holding base includes a main casing, a first holding casing, and a second holding casing. The first holding casing and the second holding casing respectively extend from two opposite sides of the main casing toward a direction away from the hinge mechanism, so that the main casing, the first holding casing, and the second holding casing cooperatively define a clamping slot with openings formed on two sides thereof for holding an electronic device. The at least one guiding member is disposed inside the clamping slot and for guiding the electronic device into the clamping slot. The at least one fixing mechanism is disposed in the holding base and linked with the hinge mechanism. The at least one fixing mechanism is capable of switching between a locking status and a releasing status, wherein the hinge mechanism drives the at least one fixing mechanism to be in the releasing status when the holding base rotates to a detaching position; the hinge mechanism drives the at least one fixing mechanism to be in the locking status when the holding base rotates to a usage position.

According to the claim disclosure, a guiding hole is formed on the electronic device. The at least one guiding member is a guiding sleeve protruding from the main casing and being capable of rotating with the holding base. The guiding sleeve is for inserting into the guiding hole. The hinge mechanism includes a base, a shaft, and a rotating member. The base is fixed on the frame. The shaft is fixed on the base. The rotating member is pivoted to the shaft. The holding base is installed on the rotating member and capable of rotating with the rotating member, wherein a through hole is formed on the main casing for allowing the guiding sleeve to pass through and dive into the clamping slot.

According to the claimed disclosure, the at least fixing mechanism includes a cam member, an elastic member, and a pin. The cam member is combined with the shaft. The guiding sleeve protrudes from the rotating member and is located in a position corresponding to the cam member. The elastic member is disposed on the guiding sleeve. The pin movably cooperates with the guiding sleeve. The pin has a first pin end and a second pin end. The first pin end abuts against the cam member. The second pin end is located in the guiding sleeve. During the time that the holding base rotates to the usage position, the first pin end moves along a periphery of the cam member and is pushed by the cam member, so that the pin displaces along a direction from the first pin end toward the second pin end, further leading the second pin end to squeeze the elastic member to protrude from the guiding sleeve.

According to the claimed disclosure, a chamber is formed in the guiding sleeve. The second pin end of the pin is movably disposed in the chamber. The elastic member includes a body portion and a protrusion portion. The body portion is disposed on an outer surface of the guiding sleeve. The body portion has an inner side and an outer side. The inner side faces the chamber. The outer side is opposite to the chamber. The protrusion portion protrudes from the inner side and dives into the chamber. When the pin displaces along the direction from the first pin end toward the second pin end, the second pin end squeezes the protrusion portion to deform toward the outer side, so that the body portion protrudes from the outer surface of the guiding sleeve.

According to the claimed disclosure, the at least one fixing mechanism further includes a wheel member installed on the first pin end. The wheel member is for moving along the periphery of the cam member.

According to the claimed disclosure, the at least one fixing mechanism further includes a resilient member sheathing on the first pin end and resiliently abutting against the cam member. The resilient member is for driving the wheel member to move along the periphery of the cam member and driving the pin to displace along a direction from the second pin end toward the first pin end during the time that the holding base rotates to the detaching position.

According to the claimed disclosure, a guiding hole is formed on the electronic device. The at least guiding member is a guiding pillar protruding from the main casing and being capable of rotating with the holding base. The guiding pillar is for inserting into the guiding hole, and the at least one fixing mechanism includes a rotating arm and a recovering member. The rotating arm has a first arm end and a second arm end. The first arm end is pivoted to the main casing. The second arm end extends into the first holding casing for engaging with an engaging hole of the electronic device. The recovering member is disposed in the main casing and capable of rotating with the main casing. The recovering member is for driving the rotating arm to rotate relative to the main casing, so that the second arm end engages with the engaging hole.

According to the claimed disclosure, the docking device further includes a pushing block and a fixing structure. The pushing block is disposed on the frame. The fixing structure is disposed on the holding base. The recovering member has a fixing end and a free end. The fixing end abuts against the fixing structure. The free end abuts against the rotating arm. The rotating arm is driven by the main casing to abut against the pushing block, further leading the pushing block to stop the rotating arm from rotating with the main casing during the time that the holding base rotates to the detaching position; the rotating arm is driven by the main casing to depart from the pushing block, and the recovering member drives the second arm end of the rotating arm to rotate out of the first holding casing during the time that the holding base rotates to the usage position.

According to the claimed disclosure, a front edge of the at least one guiding member exceeds a front edge of second holding casing.

According to the claimed disclosure, the docking device further includes an electrical connector disposed in the clamping slot and coupled to a display unit installed on the frame. The electrical connector is for coupling the electronic device to the display unit.

According to the claimed disclosure, a display device includes a frame, a display unit, and a docking device. The display unit is disposed on the frame. The docking device is installed on the frame and includes a hinge mechanism, a holding base, at least one guiding member, and at least one fixing mechanism. The hinge mechanism is installed on the frame. The holding base is pivoted to the frame by the hinge mechanism and includes a main casing, a first holding casing, and a second holding casing. The first holding casing and the second holding casing respectively extend from two opposite sides of the main casing toward a direction far from the hinge mechanism, so that the main casing, the first holding casing, and the second holding casing cooperatively define a clamping slot with openings formed on two sides thereof for holding an electronic device. The at least one guiding member is disposed inside the clamping slot and for guiding the electronic device into the clamping slot. The at least one fixing mechanism is disposed in the holding base and linked by the hinge mechanism. The at least one fixing mechanism is capable of switching between a locking status and a releasing status, wherein the hinge mechanism drives the at least one fixing mechanism to be in the releasing status when the holding base rotates to a detaching position; the hinge mechanism drives the at least one fixing mechanism to be in the locking status when the holding base rotates to a usage position.

In summary, the present disclosure utilizes the guiding member for properly orienting and guiding the electronic device into the clamping slot on the holding base. In such a manner, the connector of the electronic device is able to be aligned with the connector of the docking device during an aforementioned process, so as to prevent the connector of the electronic device and the connector of the docking device from being damaged due to improper alignment. Furthermore, when the electronic device is guided into the clamping slot on the holding base, the present disclosure further utilizes a fixing mechanism for fixing the electronic device in the clamping slot, so as to prevent the electronic device from detaching from the clamping slot. Thus, it further prevents the connectors from improper mating. Besides, since the clamping slot for holding the electronic device has the openings formed on the two sides thereof, the openings on the two sides of the clamping slot do not constrain a width of the electronic device that is held by the clamping slot. In other words, the holding base of the present disclosure is able to hold electronic devices with different sizes by design of the clamping slot with the openings formed on the two sides thereof.

These and other objectives of the present disclosure will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part hereof, and in which is shown by way of illustration specific embodiments in which the disclosure may be practiced. In this regard, directional terminology, such as "top," "bottom," etc., is used with reference to the orientation of the Figure(s) being described. The components of the present disclosure can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present disclosure. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and "installed" and variations thereof herein are used broadly and encompass direct and indirect connections and installations. Accordingly, the drawings and descriptions will be regarded as illustrative in nature and not as restrictive.

Figure 1:
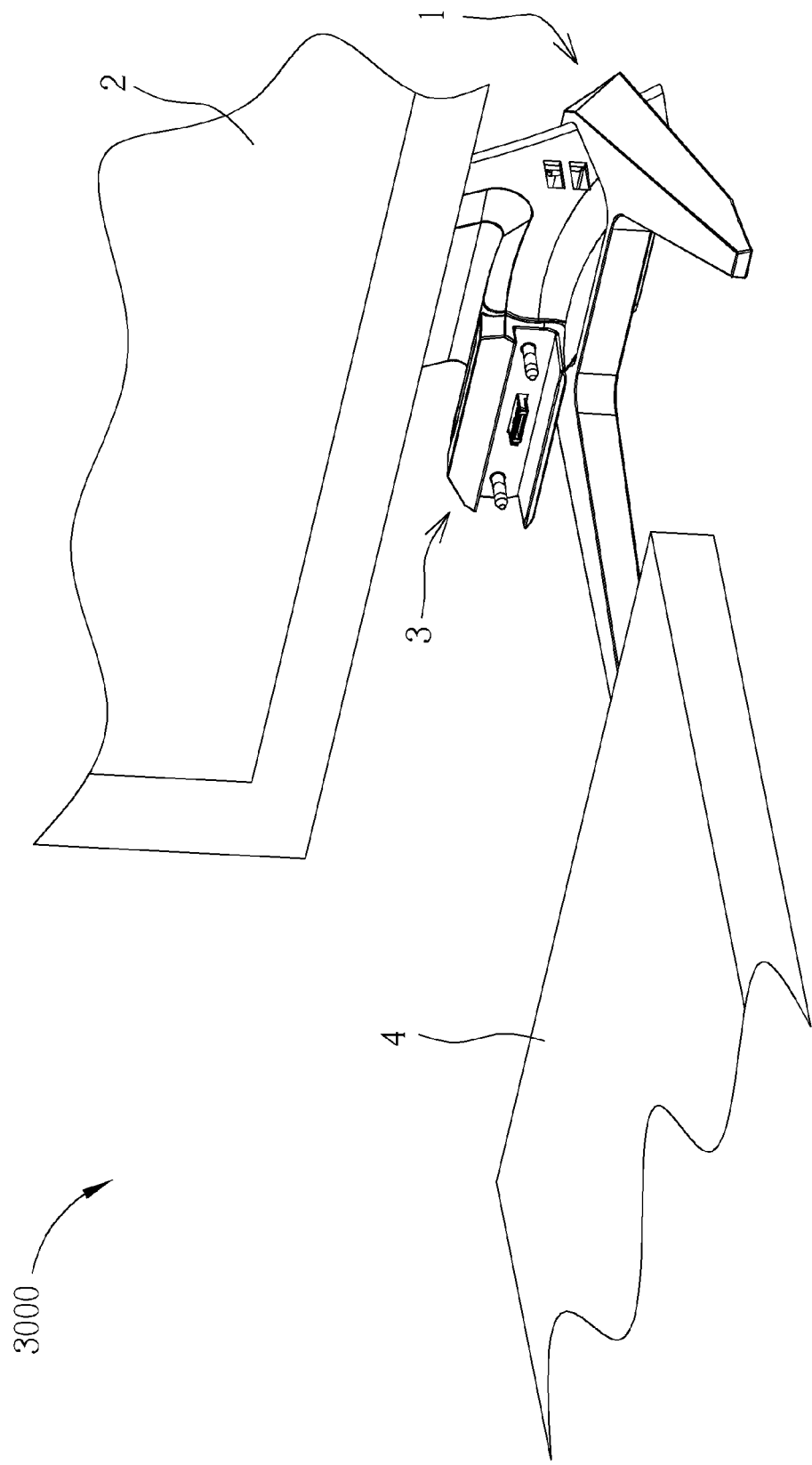
FIG. 1 is a schematic diagram of a display device of the present disclosure.

Please refer to FIG. 1. FIG. 1 is a schematic diagram of a display device 3000 of the present disclosure. As shown in FIG. 1, the display device 3000 includes a frame 1, a display unit 2, and an adjustable docking device 3. The display unit 2 and the docking device 3 both are installed on the frame 1. The frame 1 is used for supporting the display unit 2 and the docking device 3 on a supporting surface, not shown in figures, such as a desktop, a ground surface. The docking device 3 is used for coupling the display unit 2 to an electronic device 4, so that the display unit 2 displays an interface of the electronic device 4 for allowing users to deal with the desired affairs executed by the electronic device 4 by utilizing the display unit 2. In this embodiment, the display unit 2 is a liquid crystal display module, such as a liquid crystal monitor, a liquid crystal television. The electronic device 4 is a portable electronic device, such as a tablet computer.

Figure 2:
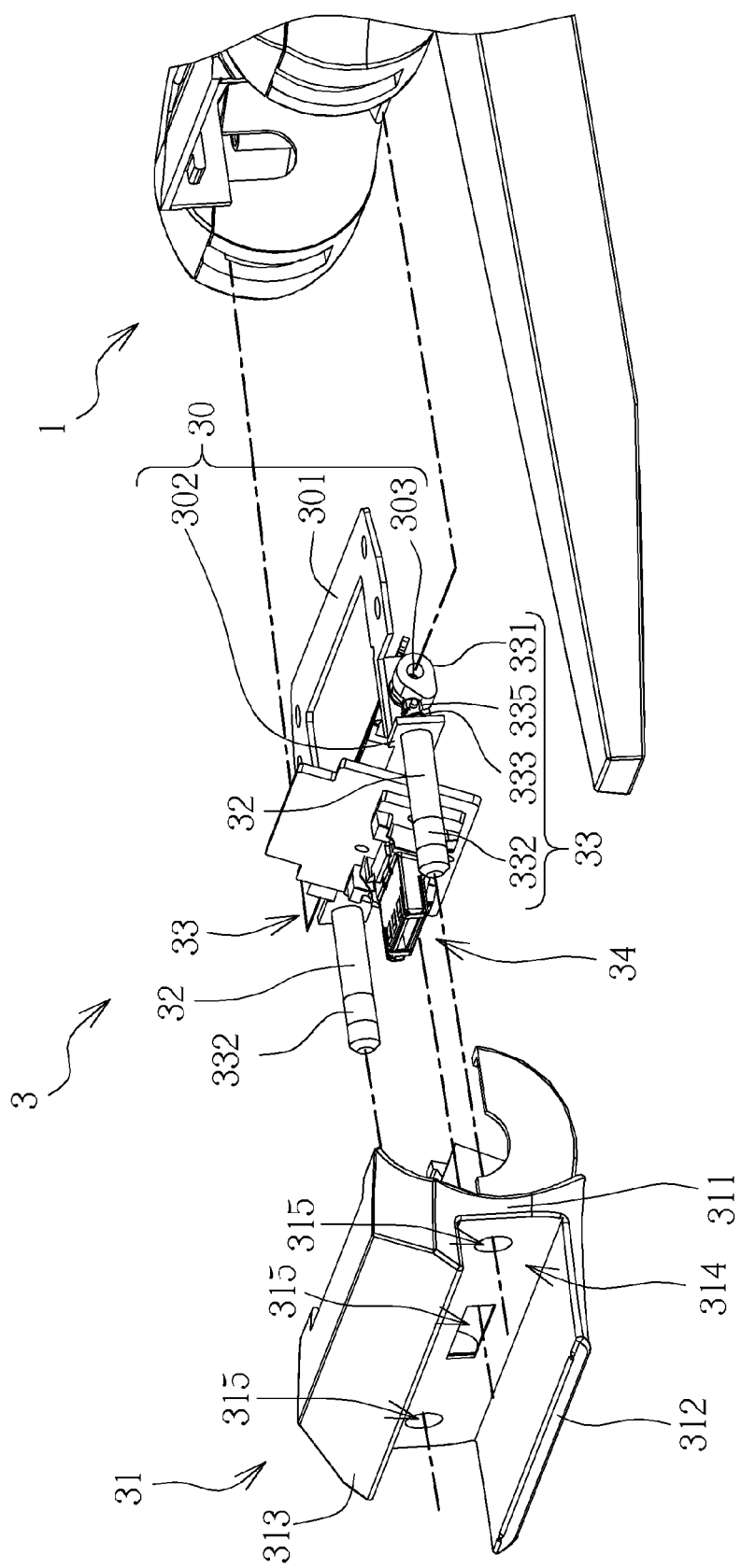
FIG. 2 is an exploded diagram of a frame and a docking device according to a first embodiment of the present disclosure.
Figure 3:
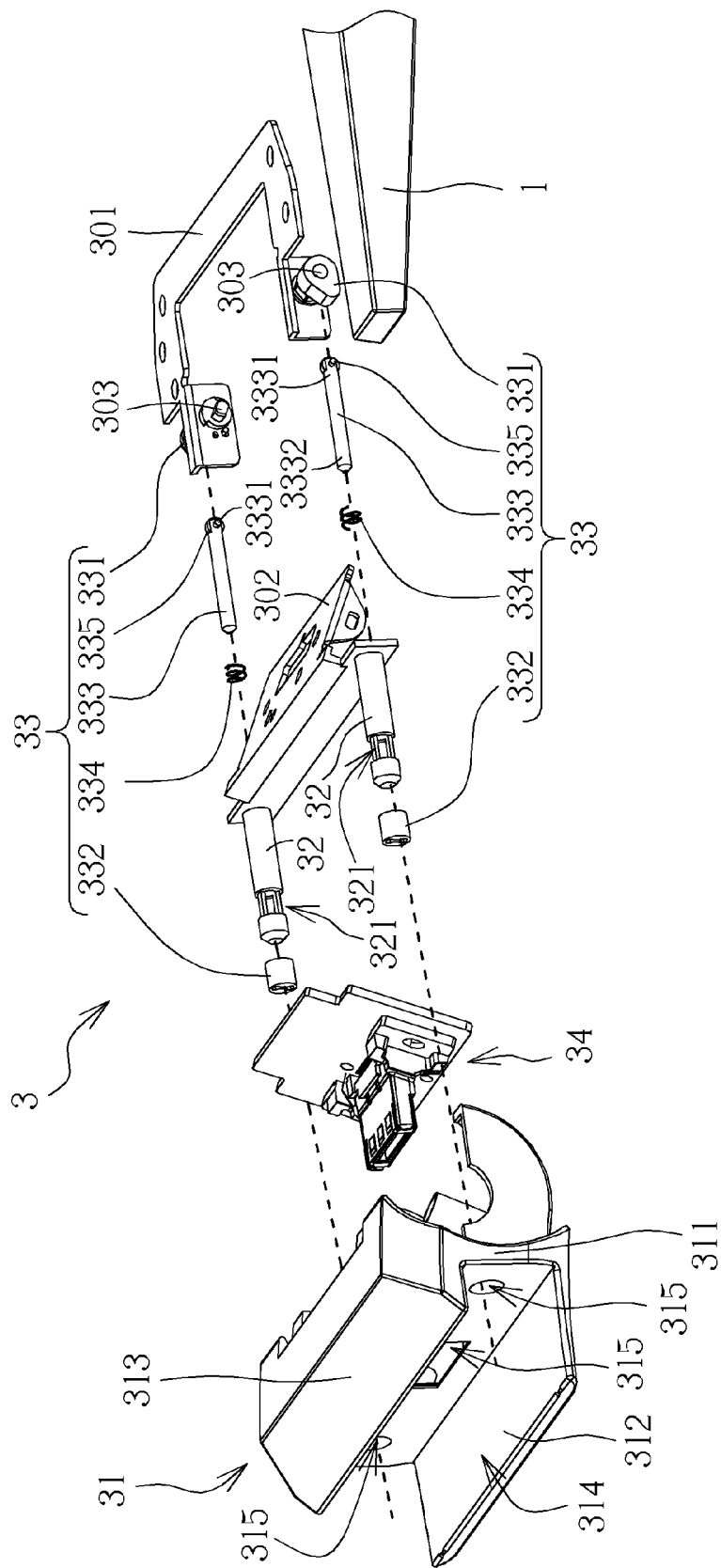
FIG. 3 is an exploded diagram of the docking device according to the first embodiment of the present disclosure.

Please refer to FIG. 1 to FIG. 3. FIG. 2 is an exploded diagram of the frame 1 and the docking device 3 according to a first embodiment of the present disclosure. FIG. 3 is an exploded diagram of the docking device 3 according to the first embodiment of the present disclosure. As shown in FIG. 1 to FIG. 3, the docking device 3 includes a hinge mechanism 30, a holding base 31, two guiding members 32, two fixing mechanisms 33, and an electrical connector 34. The hinge mechanism 30 is installed on the frame 1. The holding base 31 is pivoted to the frame 1 by the hinged mechanism 30, so that the holding base 31 is able to rotate relative to the frame 1. Furthermore, the holding base 31 includes a main casing 311, a first holding casing 312, and a second holding casing 313. The first holding casing 312 and the second holding casing 313 respectively extend from two opposite sides of the main casing 311 along a direction away from the hinge mechanism 30. Accordingly, the main casing 311, the first holding casing 312, and the second holding casing 313 cooperatively define a clamping slot 314 with openings formed on two sides thereof, so that the holding base 31 holds the electronic device 4 by utilizing the clamping slot 314.

It should be noted that since the openings are formed on the two sides of the clamping slot 314 on the holding base 31 of the present disclosure, the openings on the two sides of the clamping slot 314 do not constrain a width of the electronic device 4 that is held by the clamping slot 314. In other words, the holding base 31 of the present disclosure is capable of holding electronic devices with different widths by structural design of the clamping slot 314 with the openings formed on the two sides thereof. Furthermore, the two guiding members 32 and the electrical connector 34 are both disposed in the clamping slot 314. The two fixing mechanisms 33 are disposed in the holding base 31, and the electrical connector 34 is coupled to the display unit 2. Those amounts and configuration of the guiding member 32 and the fixing mechanism 33 are not limited to those illustrated in figures in this embodiment. The docking device 3 can include one guiding member 32 and one fixing mechanism 33 as well, and it depends on the practical demands.

Besides, since the guiding member 32 is used for guiding the electronic device 4 into the clamping slot 314 on the holding base 31 and the holding base 31 is pivoted to the frame 1 by the hinge mechanism 30, the holding base 31 is capable of rotating relative to the frame 1 between a detaching position and a usage position. Furthermore, the fixing mechanism 33 is linked with the hinge mechanism 30 and capable of switching between a locking status and a releasing status. Therefore, when the holding base 31 rotates to the detaching position, the hinge mechanism 30 drives the fixing mechanism 33 to be in the releasing status for detaching the electronic device 4 from clamping slot 314 on the holding base 31; or when the holding base 31 rotates to the usage position, the hinge mechanism 30 further drives the fixing mechanism 33 to be in the locking status for fixing the electronic device 4 in the clamping slot 314 on the holding base 31. Detailed structures and operation principles of the fixing mechanism 33 are described as follows.

In this embodiment, the two guiding members 32 are respectively a guiding sleeve, and each of the two fixing mechanisms 33 includes a cam member 331, an elastic member 332, and a pin 333. The hinge mechanism 30 includes a base 301, a rotating member 302, and a shaft 303. The shaft 303 is fixed on the base 301 and the rotating member 302 is pivoted to the shaft 303, so that the rotating member 302 is pivoted to the base 301 by the shaft 303. The base 301 is fixed on the frame 1 for providing a foundation that allows the rotating member 302 to rotate relative to the frame 1. Furthermore, the cam member 331 is combined with the shaft 303, and the guiding sleeve, i.e. the guiding member 32, protrudes from the rotating member 302 and is located in a position corresponding to the cam member 331. The holding base 31 and the electrical connector 34 are both installed on the rotating member 302, so that the guiding sleeve, i.e. the guiding member 32, the holding base 31, and the electrical connector 34 rotate with the rotating member 302 relative to the frame 1. In addition, three through holes 315 are formed on the main casing 331 of holding base 31, wherein the two through holes 315 formed on two lateral sides of the main casing 311 are circular holes for allowing the guiding sleeve to pass through and protrude from the main casing 311, leading the guiding sleeve to dive into the clamping slot 314; a through hole 315 formed in middle of the main casing 311 is a rectangular hole for allowing the electrical connector 34 to pass through and dive into the clamping slot 314.

Figure 4:
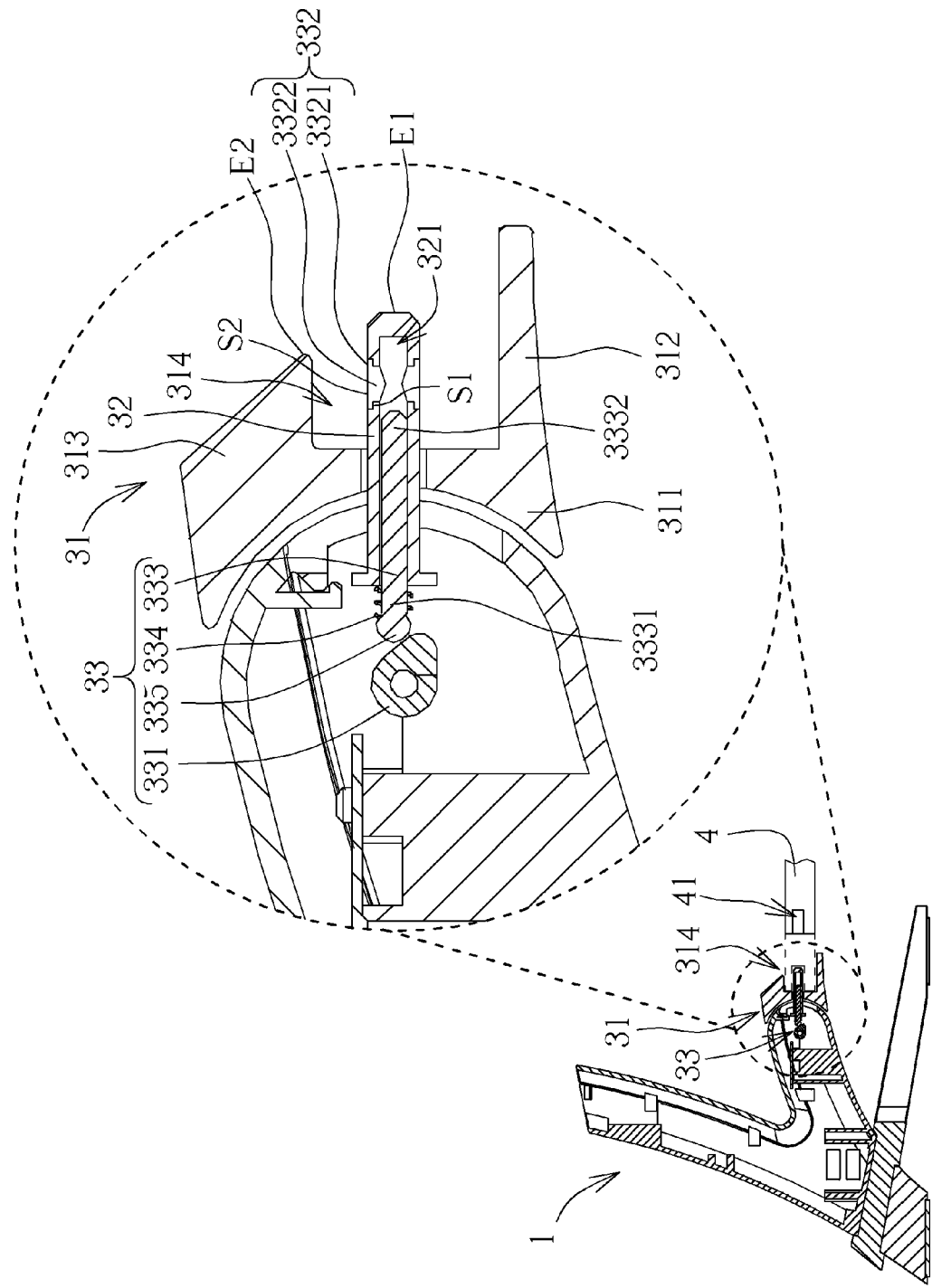
FIG. 4 is a sectional diagram of the docking device in a detaching status according to the first embodiment of the present disclosure.

Please refer to FIG. 2 to FIG. 4. FIG. 4 is a sectional diagram of the docking device 3 in a detaching status according to the first embodiment of the present disclosure. As shown in FIG. 2 to FIG. 4, a chamber 321 is formed in the guiding sleeve, i.e. the guiding member 32, and the pin 333 has a first pin end 3331 and a second pin end 3332. The first pin end 3331 abuts against the cam member 331 and the second pin end 3332 is movably disposed in the chamber 321 of the guiding sleeve. Accordingly, the pin 333 cooperates with the guiding sleeve, i.e. the guiding member 32 in a movable manner. Furthermore, the elastic member 332 includes a body portion 3321 and a protrusion portion 3322. The body portion 3321 is disposed on an outer surface of the guiding sleeve for installing the elastic member 332 on the guiding sleeve. The body portion 3321 has an inner side S1 and an outer side S2, wherein the inner side S1 faces the chamber 321 and the outer side S2 is opposite to the chamber 321. In addition, the protrusion portion 3322 protrudes from the inner side S1 and dives into the chamber 321. Besides, each of the fixing mechanisms 33 further includes a resilient member 334 and a wheel member 335. The wheel member 335 is installed on the first pin end 3331 of the pin 333 and capable of moving along a periphery of the cam member 331. The resilient member 334 sheathes on the first pin end 3331 and resiliently abuts against the wheel member 335. In this embodiment, the resilient member 334 is a spring, but the present disclosure is not limited thereto.

Figure 5:
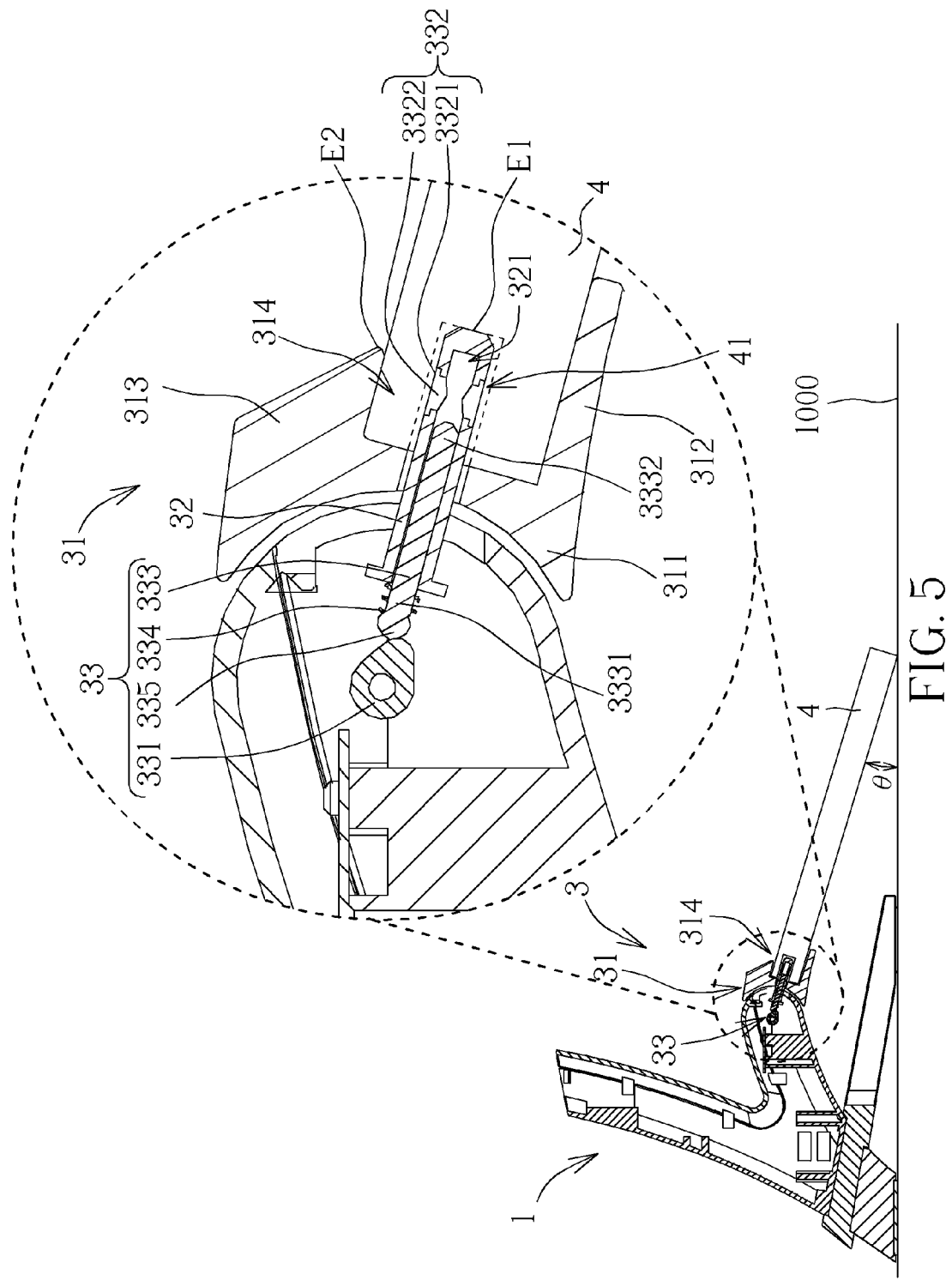
FIG. 5 is a sectional diagram of the docking device in a usage status according to the first embodiment of the present disclosure.

Please refer to FIG. 4 and FIG. 5. FIG. 5 is a sectional diagram of the docking device 3 in a usage status according to the first embodiment of the present disclosure. As shown in FIG. 4 and FIG. 5, when the docking device 3 is utilized for coupling the electronic device 4 to the display unit 2, first of all, the electronic device 4 is inserted into the clamping slot 314 on the holding base 31 in the detaching position, as shown in FIG. 4. During the above-mentioned process, the guiding sleeve, i.e. the guiding member 32, inserts into a guiding hole 41 on the electronic device 4 for guiding the electronic device 4 from a position illustrated in solid lines to another position illustrated in dashed lines, as shown in FIG. 4. In other words, by the above-mentioned structural cooperation between the guiding sleeve and the guiding hole on the electronic device 4, the guiding member 32 is capable of guiding the electronic device 4 into the clamping slot 314, so that the holding base 31 is able to hold the electronic device 4.

It should be noted that in order to facilitate to align the guiding hole 41 on the electronic device 4 with the guiding sleeve, i.e. the guiding member 32, in practical application, a front edge E1 of the guiding sleeve can be designed to exceed a front edge E2 of the second holding casing 313, so that the guiding member 32 is located out of a range covered by the second holding casing 313, as shown in FIG. 4 and FIG. 5. Accordingly, the users can see the front edge E1 of the guiding member 32 from a top view of the holding base 31, so as to align the guiding hole 41 on the electronic device 4 with the guiding sleeve, leading the electronic device 4 to be properly guided into the clamping slot 314.

In such a manner, the connector, not shown in figures, of the electronic device 4 can be properly aligned with the electrical connector 34 of the docking device 3, so as to prevent the electrical connector 34 of the docking device 3 and the connector of the electronic device 4 from being damaged during the above-mentioned mating process. Furthermore, after the holding base 31 holds the electronic device 4, the weight of the electronic device 4 drives the holding base 31 to rotate relative to the frame 1, so that the electronic device 4 and the holding base 31 is able to rotate relative to the frame 1 to a usage position shown in FIG. 5. When the electronic device 4 and the holding base is in the usage position, a side of the electronic device 4 is supported on the supporting surface 1000, and an angle θ is included between the electronic device 4 and the supporting surface 1000 for adjusting an angle between the electronic device 4 and the user, leading to convenience of operation of the electronic device 4.

In summary, during the time that the holding base 31 rotates to the usage position, the wheel 335 displaces on a periphery of the cam member 331, so that the first pin end 3331 of the pin 333 moves along the periphery of the cam member 331, leading the first pin end 3331 of the pin 333 to be pushed by the cam member 331. Accordingly, the pin 333 is moved by the cam member 331 and the pin 333 is further guided by the chamber 321 of the guiding sleeve, i.e. the guiding member 32 during the pushing process. Accordingly, the pin 333 displaces along a direction from the first pin end 3331 toward the second pin end 3332, i.e. a direction parallel to an orientation of the guiding sleeve. In such a manner, the second pin end 3332 squeezes the protrusion portion 3322 of the elastic member 332 to deform toward the outer side S2 of the body portion 3321, so that the body portion 3321 of the elastic member 332 protrudes from the outer surface of the guiding sleeve, as shown in FIG. 5. In such a manner, the deformed elastic member 332 squeezed by the second pin end 3332 makes the fixing mechanism 33 be in the locking status, so that the deformed elastic member 331 squeezed by the second pin end 3332 is able to tightly engage with the electronic device 4, so as to prevent the electronic device 4 from detaching from the clamping slot 314 on the holding base 31. In this embodiment, the elastic member 332 is made of rubber material, for example, carbon rubber material.

On the other hand, when the electronic device 4 is desired to be detached from the holding base 31 of the docking device 3, the electronic device 4 is rotated to the detaching position shown in FIG. 4. Meanwhile, the holding base 31 is driven to rotate to the detaching position. During the above-mentioned process, a displacement is generated between the cam member 331 and the wheel member 335. The resilient member 334 drives the wheel member 335 to stick to the cam member 331 and thus the wheel member 335 is able to move along the periphery of the cam member 331. The resilient member 334 further drives the pin 333 to displace along a direction from the second pin end 3332 toward the first pin end 3331. Accordingly, the second pin end 3332 of the pin 333 does not squeeze the protrusion portion 3322 of the elastic member 332, so that the protrusion portion 3322 of the elastic member 332 elastically recovers, i.e. the protrusion portion 3322 elastically recovers to and protrudes from the outer side S2 of the body portion 3321. Accordingly, the body portion 3321 of the elastic member 332 elastically recovers and does not protrudes from the outer surface of the guiding sleeve, i.e. the body portion 3321 recovers to a status shown in FIG. 4. In such a manner, the fixing mechanism 33 is in the releasing status, so that the electronic device is able to be detached from the clamping slot 314 on the holding base 31.

Figure 6:
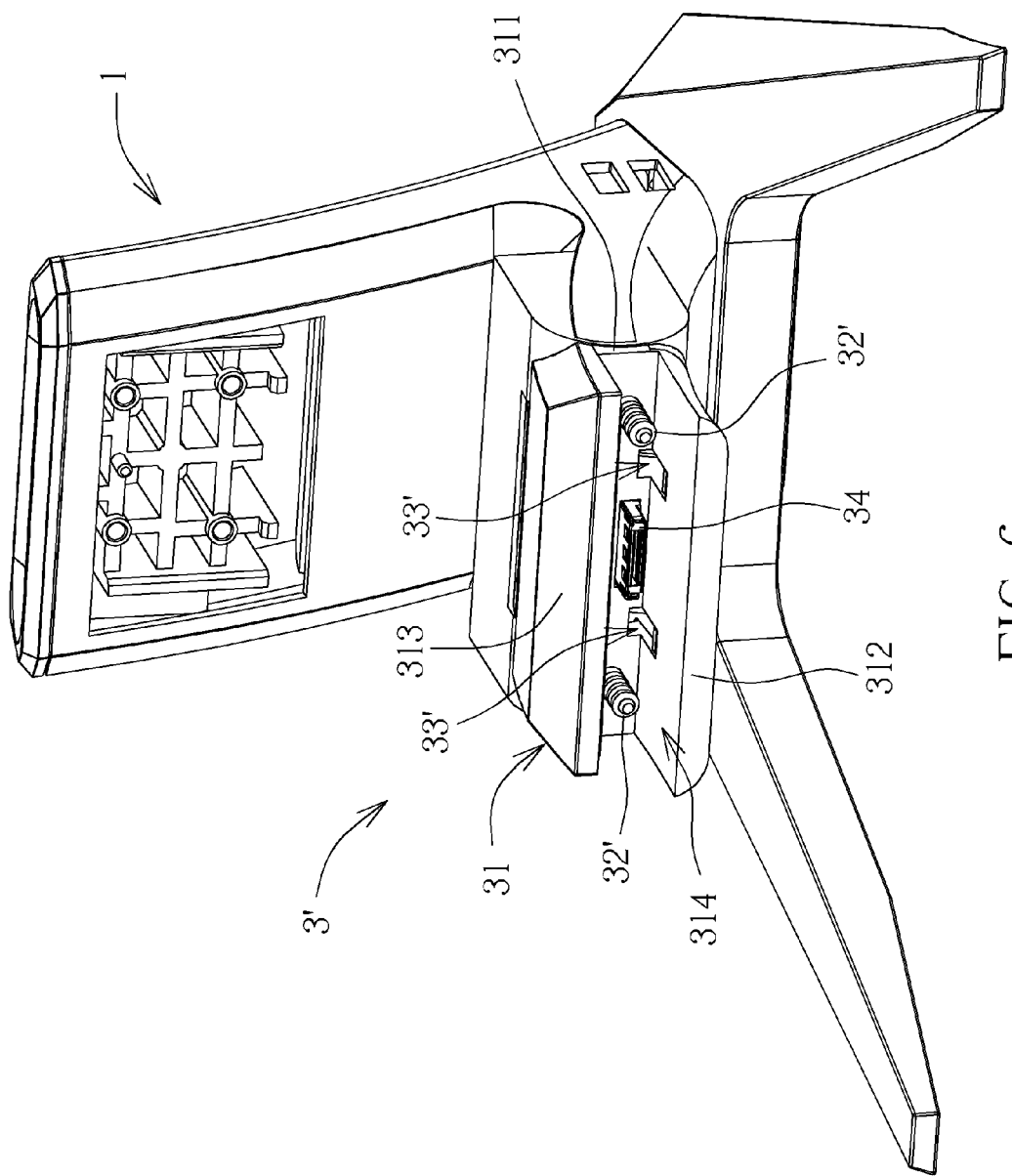
FIG. 6 is a schematic diagram of a docking device according to a second embodiment of the present disclosure.
Figure 7:
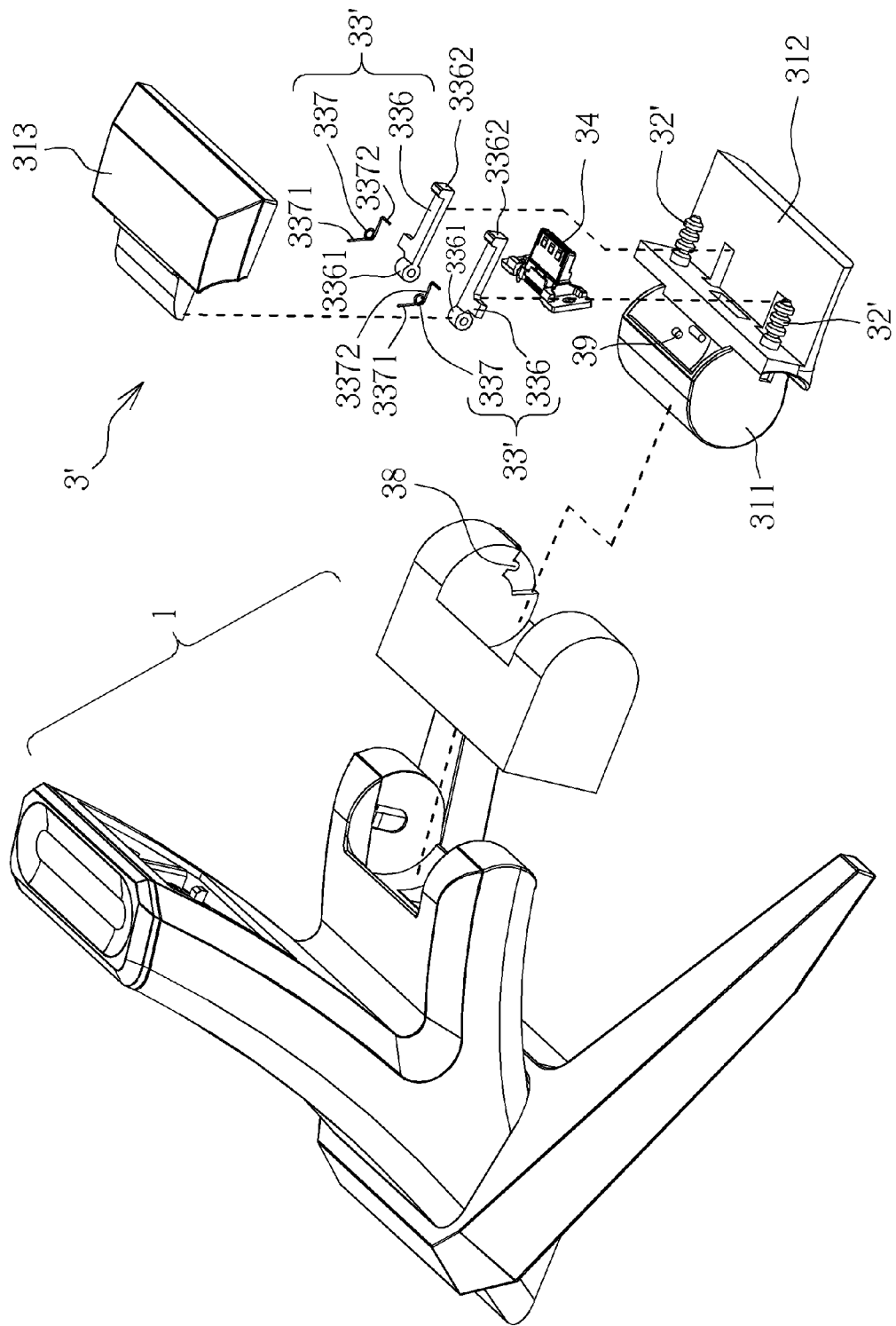
FIG. 7 is an exploded diagram of the docking device according to the second embodiment of the present disclosure.

Please refer to FIG. 6 and FIG. 7. FIG. 6 is a schematic diagram of a docking device 3' according to a second embodiment of the present disclosure. FIG. 7 is an exploded diagram of the docking device 3' according to the second embodiment of the present disclosure. The major differences between the docking device 3' and the aforesaid docking device 3 are described as follows. As shown in FIG. 6 and FIG. 7, a guiding member 32' of the docking device 3' is a solid guiding pillar. A fixing mechanism 33' is a rotating arm with engagement mechanism and includes a rotating arm 336 and a recovering member 337. The rotating arm 336 has a first arm end 3361 and a second arm end 3362. The first arm end 3361 is pivoted to the main casing 311 of the holding casing 31. The second arm end 3362 extends into the first holding casing 312. The recovering member 337 is disposed in the main casing 311 and capable of rotating with the main casing 311. In this embodiment, the recovering member 337 is a torsion spring with a fixing end 3371 and a free end 3372, and the second arm end 3362 of the rotating arm 336 has a protrusion structure 3363, but the present disclosure is not limited thereto. Furthermore, the docking device 3' further includes a pushing block 38 and a fixing structure 39. The pushing block 38 is disposed on the frame 1. The fixing structure 39 is disposed on the main casing 311 of the holding base 31. The fixing end 3371 of the recovering member 337 abuts against the fixing structure 39 of the main casing 311, and the free end 3372 of the recovering member 337 abuts against the rotating arm 336.

Figure 8:
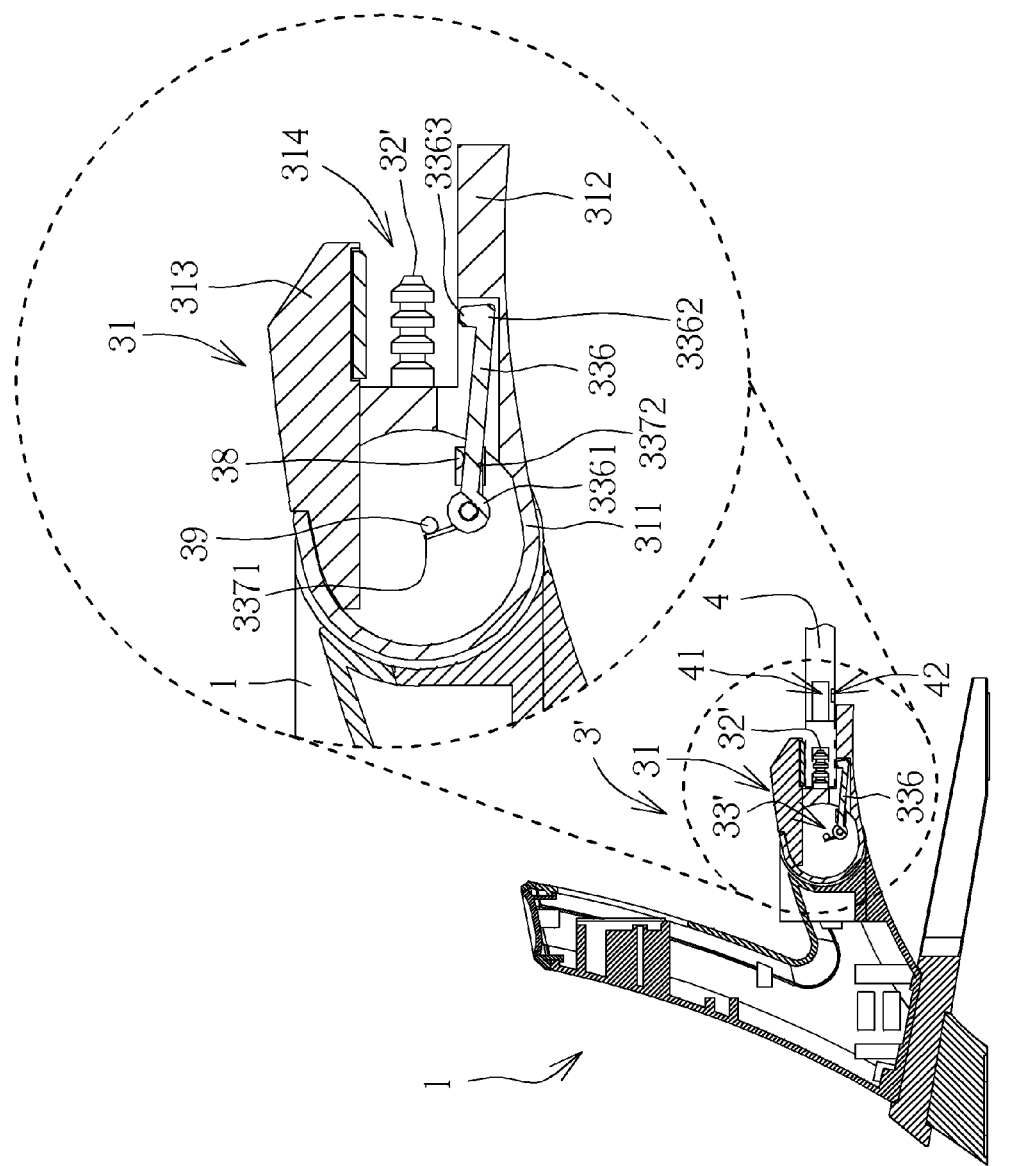
FIG. 8 is a sectional diagram of the docking device in a detaching status according to the second embodiment of the present disclosure.
Figure 9:
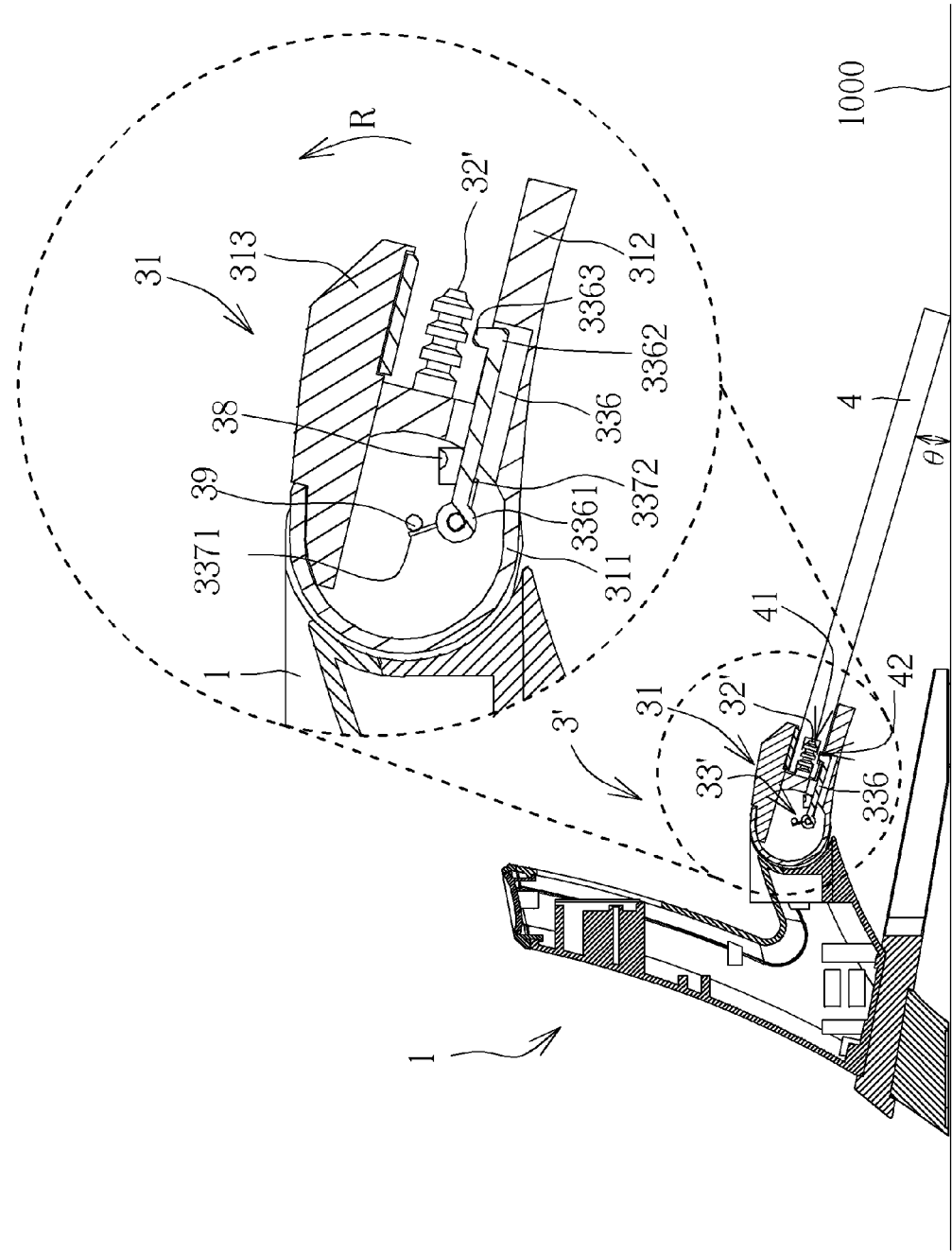
FIG. 9 is a sectional diagram of the docking device in a usage status according to the second embodiment of the present disclosure.

Please refer to FIG. 8 and FIG. 9. FIG. 8 is a sectional diagram of the docking device 3' in a detaching status according to the second embodiment of the present disclosure. FIG. 9 is a sectional diagram of the docking device 3' in a usage status according to the second embodiment of the present disclosure. As shown in FIG. 8 and FIG. 9, during the time that the holding base 31 rotates to the usage position, the rotating arm 336 is driven by the main casing 311 to depart from the pushing block 38. At the same time, the pushing block 38 does not constrain the rotating arm 336, and thus, the recovering member 337 drives the rotating arm 336 to rotate along a rotating direction R shown in FIG. 9. Furthermore, when the holding base 31 rotates to the usage position, the recovering member 337 drives the rotating arm 336 to rotate to a position shown in FIG. 9, so as to rotate the second arm end 3362 of the rotating arm 336 out of the first holding casing 312 of the holding base 31. Accordingly, the protrusion structure 3363 of the second arm end 3362 engages with an engaging hole 42 formed on a bottom side of the electronic device 4. In such a manner, the fixing mechanism 33' is in a locking status, so as to fix the electronic device 4 in the clamping slot 314 on the holding base 31.

On the other hand, when the electronic device 4 is desired to detach from the holding base 31 of the docking device 3', the electronic device 4 is rotated to the detaching position shown in FIG. 8. During the time that the holding base 31 rotates to the detaching position, the rotating arm 336 is driven by the main casing 311 to abut against the pushing block 38. At the same time, the pushing block 38 stop the rotating arm 336 from rotating with the main casing 311, so that the rotating arm 336 is incapable of rotating with the main casing 311. Accordingly, the engaging hole 42 on the bottom side of the electronic device 4 gradually departs from the protrusion structure 3363 on the second arm end 3362 when the holding base 31 continuously rotates to the detaching position. In such a manner, the fixing mechanism 33' is in the releasing status, so as to detach the electronic device 4 from the clamping slot 314 on the holding base 31. Elements that have the same structures and functions as that illustrated in the aforementioned embodiment are provided with the same item numbers in this embodiment and description are omitted herein for simplicity.

In contrast to the prior art, the present disclosure utilizes the guiding member for properly orienting and guiding the electronic device into the clamping slot on the holding base. In such a manner, the connector of the electronic device is able to be aligned with the connector of the docking device during an aforementioned process, so as to prevent the connector of the electronic device and the connector of the docking device from being damaged due to improper alignment. Furthermore, when the electronic device is guided into the clamping slot on the holding base, the present disclosure further utilizes a fixing mechanism for fixing the electronic device in the clamping slot, so as to prevent the electronic device from detaching from the clamping slot. Thus, it further prevents the connectors from improper mating. Besides, since the clamping slot for holding the electronic device has the openings formed on the two sides thereof, the openings on the two sides of the clamping slot do not constrain a width of the electronic device that is held by the clamping slot. In other words, the holding base of the present disclosure is able to hold electronic devices with different sizes by design of the clamping slot with the openings formed on the two sides thereof.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An adjustable docking device installed on a frame, comprising:
   a hinge mechanism installed on the frame;
   a holding base pivoted to the frame by the hinge mechanism, the holding base comprising a main casing, a first holding casing, and a second holding casing, the first holding casing and the second holding casing respectively extending from two opposite sides of the main casing toward a direction away from the hinge mechanism, so that the main casing, the first holding casing, and the second holding casing cooperatively define a clamping slot with openings formed on two sides thereof for holding an electronic device;
   at least one guiding member disposed inside the clamping slot and for guiding the electronic device into the clamping slot; and
   at least one fixing mechanism disposed in the holding base and linked with the hinge mechanism, the at least one fixing mechanism being capable of switching between a locking status and a releasing status, wherein the hinge mechanism drives the at least one fixing mechanism to be in the releasing status when the holding base rotates to a detaching position; the hinge mechanism drives the at least one fixing mechanism to be in the locking status when the holding base rotates to a usage position.

2. The docking device of claim 1, wherein a guiding hole is formed on the electronic device, the at least one guiding member is a guiding sleeve protruding from the main casing and being capable of rotating with the holding base, the guiding sleeve is for inserting into the guiding hole, and the hinge mechanism comprises:
   a base fixed on the frame;
   a shaft fixed on the base; and
   a rotating member pivoted to the shaft, the holding base being installed on the rotating member and capable of rotating with the rotating member, wherein a through hole is formed on the main casing for allowing the guiding sleeve to pass through and dive into the clamping slot.

3. The docking device of claim 2, wherein the at least one fixing mechanism comprises:
   a cam member combined with the shaft, the guiding sleeve protruding from the rotating member and being located in a position corresponding to the cam member;
   an elastic member disposed on the guiding sleeve; and
   a pin movably cooperating with the guiding sleeve, the pin having a first pin end and a second pin end, the first pin end abutting against the cam member, the second pin end being located in the guiding sleeve, during the time that the holding base rotates to the usage position, the first pin end moving along a periphery of the cam member and being pushed by the cam member, so that the pin displaces along a direction from the first pin end toward the second pin end, leading the second pin end to squeeze the elastic member to protrude from the guiding sleeve.

4. The docking device of claim 3, wherein a chamber is formed in the guiding sleeve, the second pin end of the pin is movably disposed in the chamber, and the elastic member comprises:
   a body portion disposed on an outer surface of the guiding sleeve, the body portion having an inner side and an outer side, the inner side facing the chamber, the outer side being opposite to the chamber; and
   a protrusion portion protruding from the inner side and diving into the chamber, when the pin displaces along the direction from the first pin end toward the second pin end, the second pin end squeezing the protrusion portion to deform toward the outer side, so that the body portion protrudes from the outer surface of the guiding sleeve.

5. The docking device of claim 3, wherein the at least one fixing mechanism further comprises:
   a wheel member installed on the first pin end, the wheel member being for moving along the periphery of the cam member.

6. The docking device of claim 5, wherein the at least one fixing mechanism further comprises:
   a resilient member sheathing on the first pin end and resiliently abutting against the cam member, the resilient member being for driving the wheel member to move along the periphery of the cam member and driving the pin to displace along a direction from the second pin end toward the first pin end during the time that the holding base rotates to the detaching position.

7. The docking device of claim 1, wherein a guiding hole is formed on the electronic device, the at least guiding member is a guiding pillar protruding from the main casing and being capable of rotating with the holding base, the guiding pillar is for inserting into the guiding hole, and the at least one fixing mechanism comprises:
   a rotating arm having a first arm end and a second arm end, the first arm end being pivoted to the main casing, the second arm end extending into the first holding casing for engaging with an engaging hole of the electronic device; and
   a recovering member disposed in the main casing and capable of rotating with the main casing, the recovering member being for driving the rotating arm to rotate relative to the main casing, so that the second arm end engages with the engaging hole.

8. The docking device of claim 7, further comprising a pushing block and a fixing structure, the pushing block being disposed on the frame, the fixing structure being disposed on the holding base, the recovering member having a fixing end and a free end, the fixing end abutting against the fixing structure, the free end abutting against the rotating arm, the rotating arm being driven by the main casing to abut against the pushing block, leading the pushing block to stop the rotating arm from rotating with the main casing during the time that the holding base rotates to the detaching position; the rotating arm being driven by the main casing to depart from the pushing block, and the recovering member driving the second arm end of the rotating arm to rotate out of the first holding casing during the time that the holding base rotates to the usage position.

9. The docking device of claim 1, wherein a front edge of the at least one guiding member exceeds a front edge of second holding casing.

10. The docking device of claim 1, further comprising:
an electrical connector disposed in the clamping slot and coupled to a display unit installed on the frame, the electrical connector being for coupling the electronic device to the display unit.

11. A display device comprising:
a frame;
a display unit disposed on the frame; and
a docking device installed on the frame, comprising:
a hinge mechanism installed on the frame;
a holding base pivoted to the frame by the hinge mechanism, the holding base comprising a main casing, a first holding casing, and a second holding casing, the first holding casing and the second holding casing respectively extending from two opposite sides of the main casing toward a direction away from the hinge mechanism, so that the main casing, the first holding casing, and the second holding casing cooperatively define a clamping slot with openings formed on two sides thereof for holding an electronic device;
at least one guiding member disposed inside the clamping slot and for guiding the electronic device into the clamping slot; and
at least one fixing mechanism disposed in the holding base and linked by the hinge mechanism, the at least one fixing mechanism being capable of switching between a locking status and a releasing status, wherein the hinge mechanism drives the at least one fixing mechanism to be in the releasing status when the holding base rotates to a detaching position; the hinge mechanism drives the at least one fixing mechanism to be in the locking status when the holding base rotates to a usage position.

12. The display device of claim 11, wherein a guiding hole is formed on the electronic device, the at least one guiding member is a guiding sleeve protruding from the main casing and being capable of rotating with the holding base, the guiding sleeve is for inserting into the guiding hole, and the hinge mechanism comprises:
a base fixed on the frame;
a shaft fixed on the base; and
a rotating member pivoted to the shaft, the holding base being installed on the rotating member and capable of rotating with the rotating member, wherein a through hole is formed on the main casing for allowing the guiding sleeve to pass through and dive into the clamping slot.

13. The display device of claim 12, wherein the at least one fixing mechanism comprises:
a cam member combined with the shaft, the guiding sleeve protruding from the rotating member and being located a position corresponding to the cam member;
an elastic member disposed on the guiding sleeve; and
a pin movably cooperating with the guiding sleeve, the pin having a first pin end and a second pin end, the first pin end abutting against the cam member, the second pin end being located in the guiding sleeve, during the time that the holding base rotates to the usage position, the first pin end moving along a periphery of the cam member and being pushed by the cam member, so that the pin displaces along a direction from the first pin end toward the second pin end, leading the second pin end to squeeze the elastic member to protrude from the guiding sleeve.

14. The display device of claim 13, wherein a chamber is formed in the guiding sleeve, the second pin end of the pin is movably disposed in the chamber, and the elastic member comprises:
a body portion disposed on an outer surface of the guiding sleeve, the body portion having an inner side and an outer side, the inner side facing the chamber, the outer side being opposite to the chamber; and
a protrusion portion protruding from the inner side and diving into the chamber, when the pin displaces along the direction from the first pin end toward the second pin end, the second pin end squeezing the protrusion portion to deform toward the outer side, so that the body portion protrudes from the outer surface of the guiding sleeve.

15. The display device of claim 13, wherein the at least one fixing mechanism further comprises:
a wheel member installed on the first pin end, the wheel member being for moving along the periphery of the cam member.

16. The display of claim 15, wherein the at least one fixing mechanism further comprises:
a resilient member sheathing on the first pin end and resiliently abutting against the cam member, the resilient member being for driving the wheel member to move along the periphery of the cam member and driving the pin to displace along a direction from the second pin end to the first pin end during the time that the holding base rotates to the detaching position.

17. The display device of claim 11, wherein a guiding hole is formed on the electronic device, the at least guiding member is a guiding pillar protruding from the main casing and being capable of rotating with the holding base, the guiding pillar is for inserting into the guiding hole, and the at least one fixing mechanism comprises:
a rotating arm having a first arm end and a second arm end, the first arm end being pivoted to the main casing, the second arm end extending into the first holding casing and for engaging with an engaging hole of the electronic device; and
a recovering member disposed in the main casing and capable of rotating with the main casing, the recovering member being for driving the rotating arm to rotate relative to the main casing, so that the second arm end engages with the engaging hole.

18. The display device of claim 17, further comprising a pushing block and a fixing structure, the pushing block being disposed on the frame, the fixing structure being disposed on the holding base, the recovering member having a fixing end and a free end, the fixing end abutting against the fixing structure, the free end abutting against the rotating arm, the rotating arm being driven by the main casing to abut against the pushing block, leading the pushing block to stop the rotating arm from rotating with the main casing during the time that the holding base rotates to the detaching position; the rotating arm being driven by the main casing to depart from the pushing block and the recovering member driving the second arm end of the rotating arm to rotates out of the first holding casing during the time that the holding base rotates to the usage position.

19. The display device of claim 11, wherein a front edge of the at least one guiding member exceeds a front edge of second holding casing.

20. The display device of claim 11, further comprising:
an electrical connector disposed in the clamping slot and coupled to a display unit installed on the frame, the electrical connector being for coupling the electronic device to the display unit.

* * * * *